United States Patent [19]
Zhang et al.

[11] Patent Number: 5,798,170
[45] Date of Patent: Aug. 25, 1998

[54] LONG OPERATING LIFE FOR POLYMER LIGHT-EMITTING DIODES

[75] Inventors: Chi Zhang, Goleta; Gang Yu, Santa Barbara; Yong Cao, Goleta, all of Calif.

[73] Assignee: Uniax Corporation, Santa Barbara, Calif.

[21] Appl. No.: 609,113

[22] Filed: Feb. 29, 1996

[51] Int. Cl.$^6$ .................................................. H05B 33/00
[52] U.S. Cl. ......................... 428/212; 428/209; 428/457; 428/690; 428/704; 428/917; 313/503; 313/504; 313/505; 313/506; 313/510; 257/91; 257/103; 427/66; 427/407.1
[58] Field of Search ................... 428/690, 704, 428/917, 209, 411.1, 457, 212; 313/503, 504, 505, 506, 510; 257/40, 91, 103; 427/66, 407.1

[56] References Cited

U.S. PATENT DOCUMENTS

| | | | |
|---|---|---|---|
| 5,317,169 | 5/1994 | Nakano et al. | 257/40 |
| 5,504,323 | 4/1996 | Heeger et al. | 250/214.1 |
| 5,563,424 | 10/1996 | Yang et al. | 257/40 |

OTHER PUBLICATIONS

G. Gustafsson et al., "Flexible Light –emitting diodes made from soluble conducting polymers", *Nature*, vol. 357, pp. 477–479, Jun. 11, 1992.

Y. Yang et al., "Polyaniline as a transparent electrode for polymer light–emitting diodes: Lower operating voltage and higher efficiency", *Appl. Phys. Lett.*, vol. 64, No. 10, pp. 1245–1247, Mar. 7, 1994.

Y. Yang et al., "Enhanced performance of polymer light–emitting diodes using high–surface area polyaniline network electrodes", *J. Appl. Phys.*, vol. 77, No. 2, pp. 694–698, Jan. 15, 1995.

*Primary Examiner*—Marie Yamnitzky
*Attorney, Agent, or Firm*—Burns, Doane, Swecker & Mathis L.L.P.

[57] ABSTRACT

Long-lived organic light-emitting diodes are achieved by positioning a layer comprising polyaniline in the emeraldine salt form directly contiguous with the anode side of the active light-emitting layer. Particular advantages are achieved if the emeraldine salt-containing layer has a sheet resistance of at least about $10^3$ ohms per square which can be achieved by casting the layer from solution in a polar solvent, most particularly, DMSO. The LED's can find advantageous application in displays where they exhibit long life and marked resistance to blurring, spreading or other degradations over time.

15 Claims, 14 Drawing Sheets

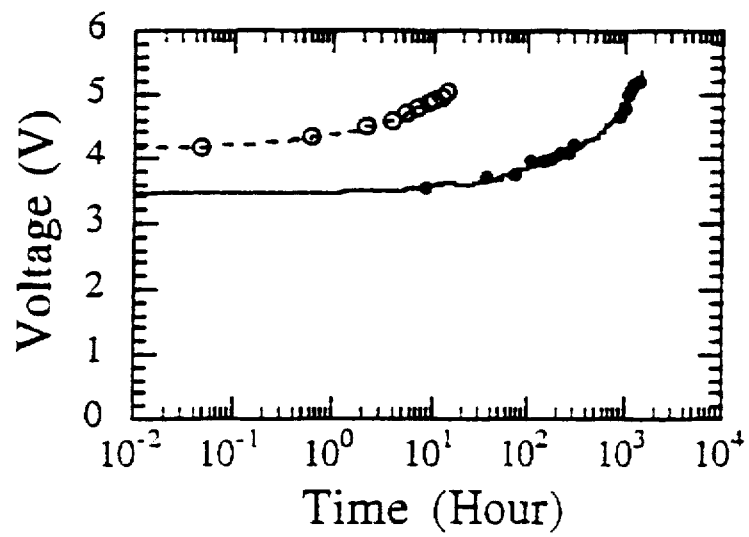
Fig. 6-a
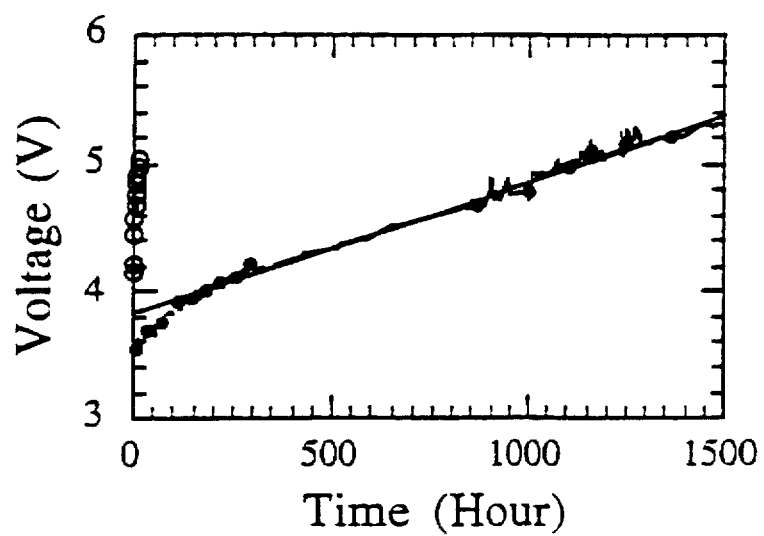
Fig. 6-b

LONG OPERATING LIFE FOR POLYMER LIGHT-EMITTING DIODES

FIELD OF THE INVENTION

The present invention relates to long-lived polymer light-emitting diodes and methods for obtaining them. The long operating life can be obtained without deleterious lateral spreading or blurring of the emitted light even when the diode electrodes on the underlying substrate is patterned. Thus, the invention also relates to a long operating life, high information content displays and their production.

BACKGROUND OF THE INVENTION

Electroluminescent diodes (or light-emitting diodes, "LEDs") based on small emitting molecules vapor deposited as thin films from vacuum were reported by Tang et al. (C. W. Tang and S. A. Van Slyke, Appl. Phys. Lett. 51, 913 (1987)); double-layer devices emitted 1000 cd/m$^2$ with an external efficiency of 1%. Such organic small molecule LEDs have been extensively developed; Kido et al (J. Kido, N. Nagai and Y. Okamoto, IEEE Transactions on Electron Devices 40, 1342 (1993)) reported luminance up to 40,000 cd/m$^2$. The class of materials suitable for organic LEDs was expande d by Burroughs et al. (J. H. Burroughs, D. D. C. Bradley, A. R. Brown, R. N. Marks, K. MacKay, R. H. Friend, P. L. Burns and A. B. Holmes, Nature 347, 539 (1990)) who demonstrated that LEDs could be made from conjugated polymers like poly(phenylenevinylene), PPV. Although the devices disclosed by Burroughs et al had low brightness and low efficiency, Braun et al (D. Braun and A. J. Heeger, Appl. Phys. Lett. 58, 1982 (1991)) showed that using the soluble PPV derivative, poly(2-methoxy-5-(2'-ethylhexyloxy)-1,4-phenylene vinylene), MEH-PPV, with a suitable low work function electron injecting cathode, polymer LEDs could achieve high brightness and quantum efficiencies of order 1% (external) (A. J. Heeger and D. Braun, U.S. Pat. No. 5,408,109). The polymer LED field has been developed extensively with a variety of conjugated polymers based primarily on the PPV structure, the poly (para-phenylene), PPP, structure and the polythiophene structure. The use of soluble derivatives of these basic structures enables relatively simple device fabrication by processing the active layer from solution (A. J. Heeger and D. Braun, U.S. Pat. No. 5,408,109).

In organic LEDs, the active organic luminescent layer(s) are sandwiched between a transparent anode, such as indium/tin-oxide (ITO) as hole-injecting contact and a low work function metal (as electron injecting contact). This structure is described in detail in D. Braun and A. J. Heeger, Appl. Phys. Lett. 58, 1982 (1991).

In the field of organic polymer-based LEDs, it has been taught in the art to employ a conducting organic polymer, such as optical quality, semitransparent, polyaniline (PANI), rather than an inorganic material such as ITO as the hole-injecting contact (Y. Yang and A. J. Heeger, Appl. Phys. Lett. 64, 1245 (1994)). Robust and mechanically flexible LEDs were demonstrated by using plastic substrates and conducting PANI as the transparent (thin film) hole-injecting contact (G. Gustafsson, Y. Cao, G. M. Treacy, F. Klavetter, N. Colaneri and A. J. Heeger, Nature 357, 477 (1992)). Multilayer composite electrodes comprising a layer of conductive PANI have been disclosed which give superior results (Y. Yang and A. J. Heeger, Appl. Phys. Lett. 64, 1245 (1994); Y. Yang, U.S. patent application Ser. No. 08/205,519). By using blends of PANI with suitable host polymers, so as to utilize the network morphology of the PANI in such blends, significantly improved injection was demonstrated with associated increases in the brightness and efficiency and with significant reduction in the operating voltage (Y. Yang, E. Westerweele, C. Zhang, P. Smith and A. J. Heeger, J. Appl. Phys. 77, 694 (1995); Y. Yang and A. J. Heeger, U.S. patent application Ser. No. 08/292,817 (now U.S. Pat. No. 5,563,424)).

The composite electrodes comprising a bilayer of PANI and ITO in the prior art have superior electrical properties as compared to ITO alone. They also have a superior combination of electrical and optical (semitransparent) and mechanical (flexible) properties to electrodes made of PANI alone. PANI, in the emeraldine salt form as prepared according to U.S. Pat. No. 5,232,631, U.S. Pat. No. 5,470,505 and Appl. Phys. Lett. 60, 2711 (1992), has a higher work function than ITO, and therefore provides better hole injection into the luminescent polymer layer than ITO (Y. Yang and A. J. Heeger, Appl. Phys. Lett. 64, 1245 (1994)).

The use of a layer of PANI in the insulating emeraldine base form (blue form) between the ITO electrode and the active polymer layer has been disclosed (U.S. Pat. No. 5,317,169). However, this patent does not disclose enhanced operating life because of the PANI layer. Indeed, the present invention demonstrates that only PANI in the emeraldine salt form (green form) serves to stabilize the device lifetime and prevent degradation such as loss of efficiency and the formation of black spots.

The brightness and efficiency of organic LEDs are sufficient to enable such devices to be utilized in display applications ranging in complexity from simple back-lights to relatively high information content displays, including for example alphanumeric displays. Unfortunately, however, there are two important problems which must be solved before organic light-emitting diodes can find use in large scale applications:

(i) The organic LEDs must have long operating life at display brightness; i.e. typically at brightness greater than 50 cd/m$^2$. Operating lifetimes in excess of 1000 hours are required for many applications. Operating lifetimes of 10,000 hours or more are required for high end applications such as alphanumeric displays, video displays, and the like.

(ii) The organic LEDs must have long shelf life. Because the devices typically comprise reactive electrodes and luminescent materials which exhibit photo-oxidative degradation, such organic LEDs must be hermetically sealed to keep out oxygen and water vapor.

Thus, a need exists for light-emitting devices which have operating lifetimes preferably in excess of 1000 hours at display brightness; more preferably in excess of 10,000 hours.

SUMMARY OF THE INVENTION

A way to achieve long operating lifetimes in organic LEDs has now been discovered. It has been found that having a layer containing PANI in the emeraldine salt form on the anode side of the light-emitting layer of such devices stabilizes device performance and prevents degradation such as loss of efficiency and the formation of dark non-emitting areas known as "black spots".

PANI in the emeraldine salt form is typically a high conductivity material, having a conductivity greater than about 1 S/cm. The high conductivity is also reflected by a sheet resistance of less than 10$^3$ ohms/square and particularly less than 10$^2$ ohms/square. In this high conductivity form, the emeraldine salt layer can itself serve as the anode (or hole injecting contact) for the LEDs. The emeraldine salt layer, in high conductivity form, can also be located between the light-emitting layer and a low sheet (surface) resistance anode layer (such as, for example, ITO).

The emeraldine salt can be processed in ways to lower its conductivity. This can lead to preferred embodiments of the invention. If emeraldine is used in accord with this invention in a high conductivity form, the LEDs produced are less advantageous in high information content displays (such as alpha numeric displays, video displays, and the like). In these devices the electrode is typically patterned, for example, into a matrix array of addressable electrodes. Highly conducting PANI and particularly high conductivity emeraldine salt form of PANI on top of the low surface resistance electrode causes lateral spreading and blurring of the image sought to be displayed on the display. While this might be avoided by registered patterning of the PANI, this solution would be costly and time consuming.

By presenting the PANI in a low conductivity emeraldine salt form, the resulting layer has sufficiently low conductivity that long operating life is obtained without deleterious lateral spreading or blurring, even when the low surface resistance electrode on the underlying substrate is patterned.

Thus, in one aspect, this invention provides an improved organic light-emitting diode which includes a light-emitting organic layer having an anode side and a cathode side with a layer containing PANI emeraldine salt in contract with the anode side. The PANI is semitransparent and can serve as the anode if it is of high enough conductivity as reflected by a sheet resistance of less than $10^3$ or preferably $10^2$ ohms/square.

In another embodiment, the diode can additionally include a separate semitransparent anode layer such that the diode includes a semitransparent anode having a low surface resistance and an organic light-emitting layer separated from one another by an intermediate layer made up of PANI. This PANI is in the form of emeraldine salt. Such a diode can offer an operating life greater than a thousand hours and even greater than ten thousand hours.

In another aspect of this invention, the organic light-emitting diode may comprise a layer of PANI emeraldine salt in a low conductivity form as shown by a surface resistance greater than $10^3$ ohms per square. With this high resistance PANI layer, long operating life is enabled in high information content displays without the need for registered patterning of the PANI layer. This aspect of the invention prevents or minimizes lateral spreading or blurring even when the low surface resistance electrode, for example, ITO, is patterned.

In an additional aspect, this invention provides methods for producing these light-emitting diodes. In one method the device is prepared by laying down a layer of PANI emeraldine salt continuous with the anode side of the light-emitting layer or between the light-emitting layer and a low surface resistance anode. In another method, a light-emitting diode is prepared by laying down a layer of low conductivity PANI emeraldine salt (that is with a conductivity corresponding to a sheet resistance of greater than about $10^3$ ohms per square) between the light-emitting layer and a low surface resistance anode.

In a more preferred aspect of the invention, the organic LED comprises, on its anode side, a layer of PANI emeraldine salt; the PANI layer cast from solution in a suitable solvent to provide a sheet resistance greater than $10^3$, especially $10^4$ and preferably even $10^5$ ohms per square.

This high sheet resistance enables long operating life, high information content displays without need for registered patterning of the PANI layer and without deleterious lateral spreading or blurring even when the low surface resistance electrode, for example indium/tin-oxide, on the underlying substrate is patterned.

In yet a more preferred aspect of the invention, the organic LED comprises an anode comprised of a layer of PANI in the emeraldine salt form. The PANI layer having been cast from solution in dimethylsulfoxide, DMSO, and having a surface resistance greater than $10^5$ ohms per square. This high surface resistance enables long operating life, high information content displays without need for registered patterning of the PANI layer and without deleterious lateral spreading or blurring even when the low surface resistance electrode, for example indium/tin-oxide, on the underlying substrate is patterned.

In addition to being embodied as a long operating life light-emitting device this invention can take the form of a system for light emission. This system includes a device of the type described in combination with a power supply applying an effective powering voltage across the pair of anode and cathode contact layers, with the power supply powering the device for at least $10^3$ hours with minimal loss in device performance over that period.

In yet a further aspect, this invention provides a process for generating useful levels of light over prolonged periods of time. The organic LED used in this process has an anode containing a layer of PANI in the low conductivity emeraldine salt form. This PANI layer is cast from solution in a suitable solvent and has sufficiently high surface resistance to enable long operating life, high information content displays without need for registered patterning of the PANI layer and without deleterious lateral spreading or blurring even when the indium/tin-oxide on the underlying substrate is patterned. This process involves applying an effective powering voltage across the electrodes of the LED just described, causing the system to emit light and using the light so emitted for, for example, illumination or display purposes over a prolonged period of time of at least about $10^3$ hours. The light so emitted and used can be polarized, if desired.

DETAILED DESCRIPTION OF THE INVENTION

This Detailed Description has the following subsections:

BRIEF DESCRIPTION OF THE DRAWINGS
DESCRIPTION OF THE PREFERRED EMBODIMENTS EXAMPLES

BRIEF DESCRIPTION OF THE DRAWINGS

This invention will be described with reference being made to the drawings. In these drawings FIGS. 1-13 are graphs and displays illustrating properties of light-emitting diodes of the invention.

Figure 1A:
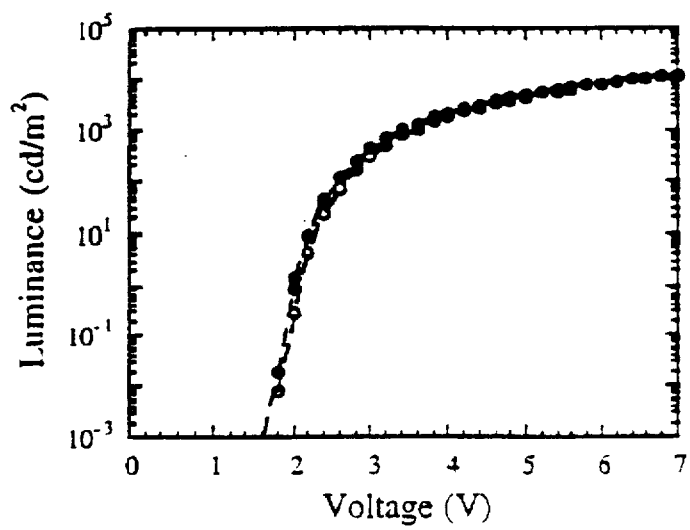

FIG. 1A is a curve showing the light-emitted as a function of voltage for an ITO/MEH-PPV/Ca device not of the invention (open circles) and an ITO/PANI-PES/MEH-PPV/Ca device of the invention (closed circles).

Figure 1B:
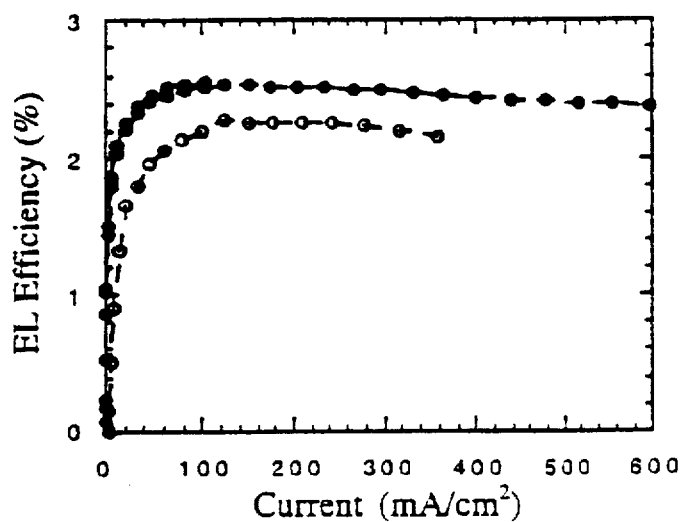

FIG. 1B illustrates device efficiency as a function of current for an ITO/MEH-PPV/Ca device not of the invention (open circles) and an ITO/PANI-PES/MEH-PPV/Ca device of the invention (closed circles).

Figure 2:
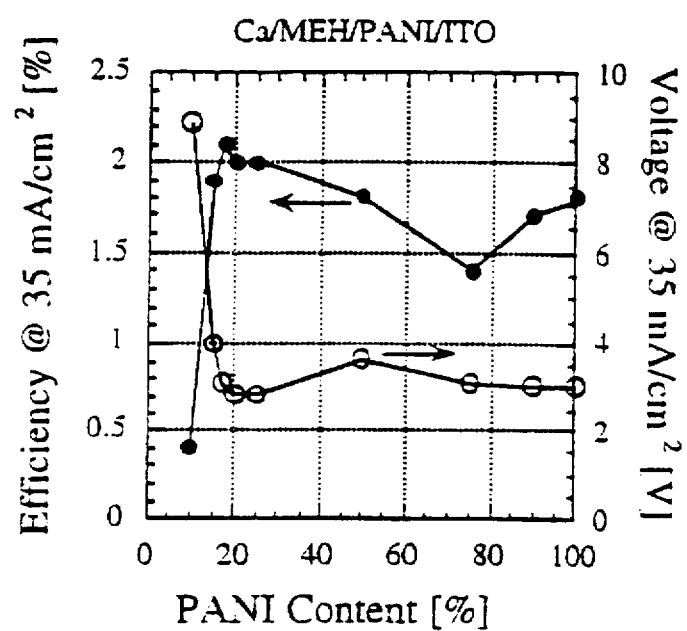

FIG. 2 illustrates various aspects of device performance of a Ca/MEH/PANI/ITO light-emitting diode as a function of PANI content.

Figure 3:
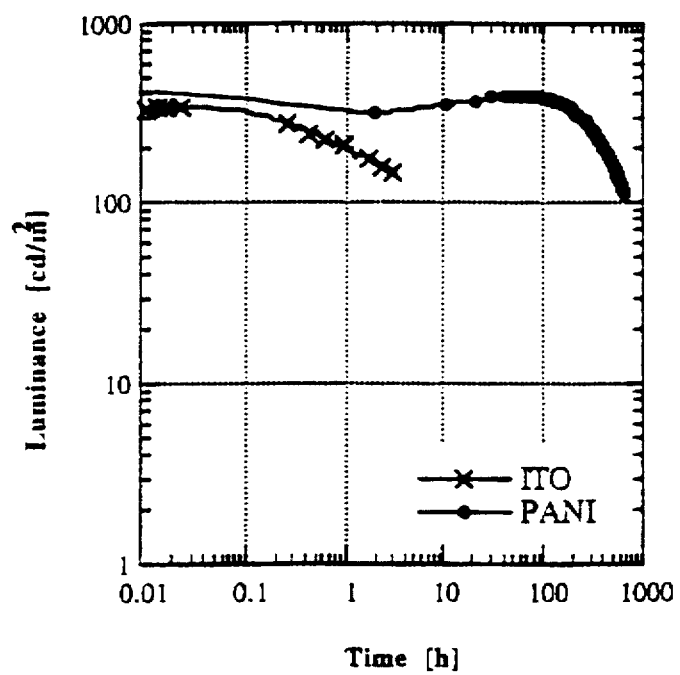

FIG. 3 illustrates the improved life achieved when the PANI layer is inserted into the device.

Figure 4:
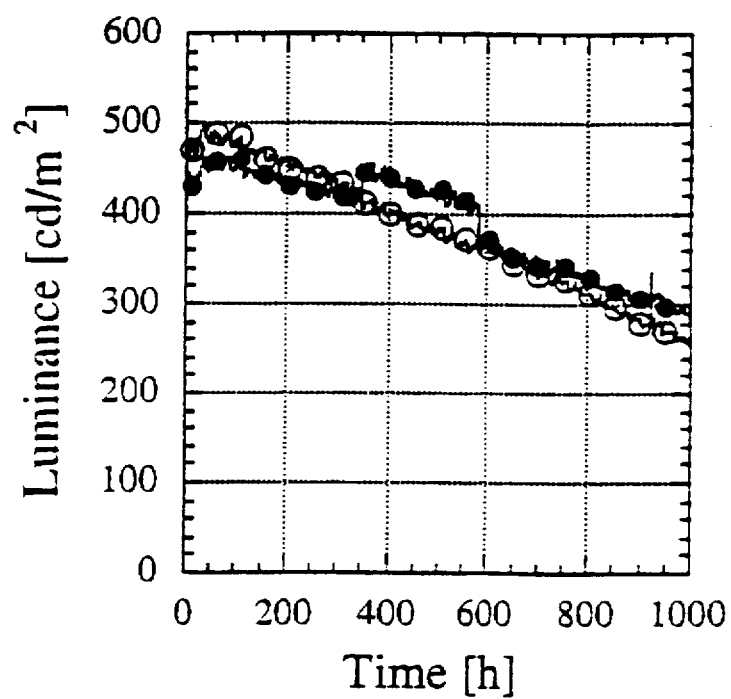

FIG. 4 is a graph of light output as a function of time for a device having a PANI-polyvinyl alcohol (25%/75%) blend layer between the light-emitting layer and the anode.

Figure 5:
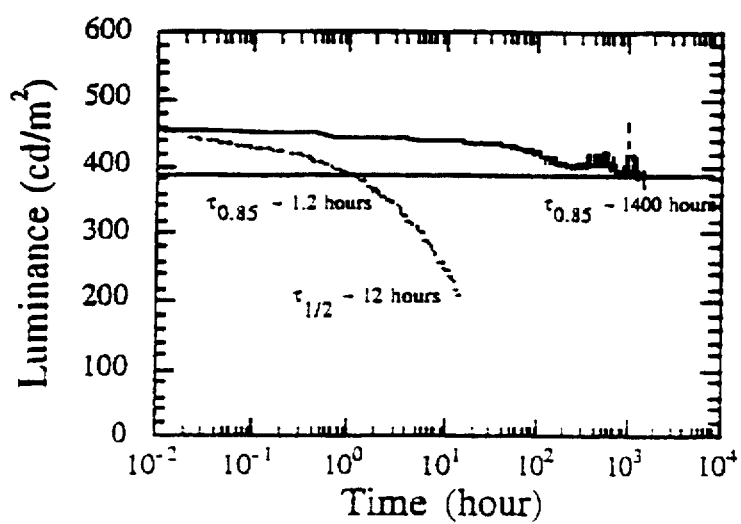

FIG. 5 illustrates light output as a function of time for an ITO/PANI-CSA/MEH-PPV/Ca (solid line) device and for a ITO/MEH-PPV/Ca device (dashed line).

FIG. 6A illustrates device life as represented by operating voltage as a function of time. In this figure the dashed line designates a device without the PANI layer and the solid curve designates the device with the PANI-CSA layer.

FIG. 6B illustrates the same information given in FIG. 6A but provided on a linear scale.

Figure 7:
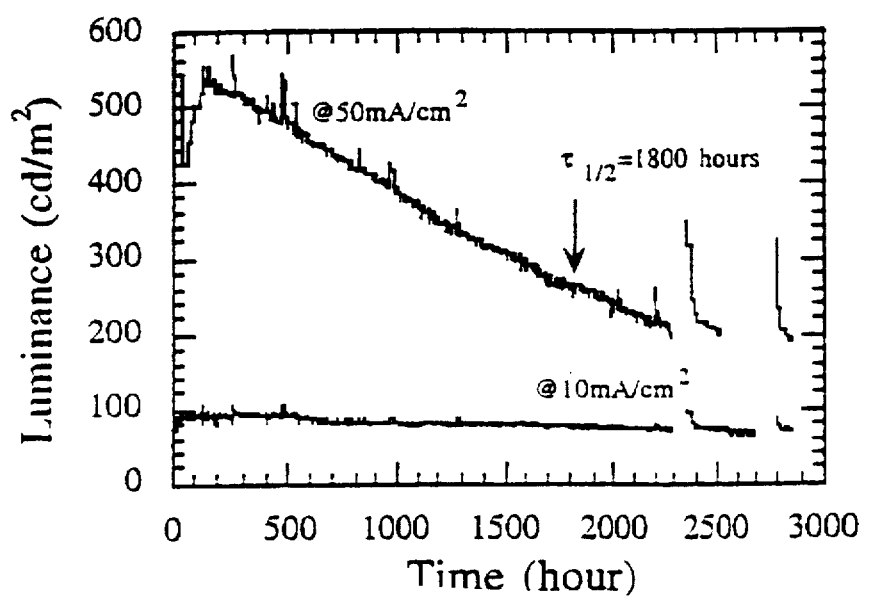

FIG. 7 illustrates light output as a function of time (L-t data) for a polymer LED with a PANI layer.

Figure 8:
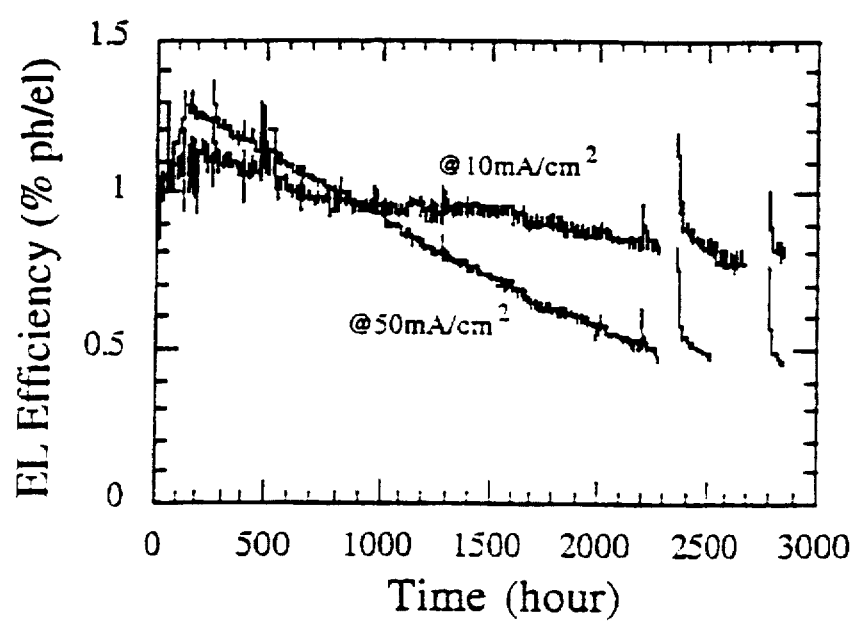

FIG. 8 illustrates efficiency as a function of time ($\eta$-t data) for a polymer LED with a PANI layer.

Figure 9:
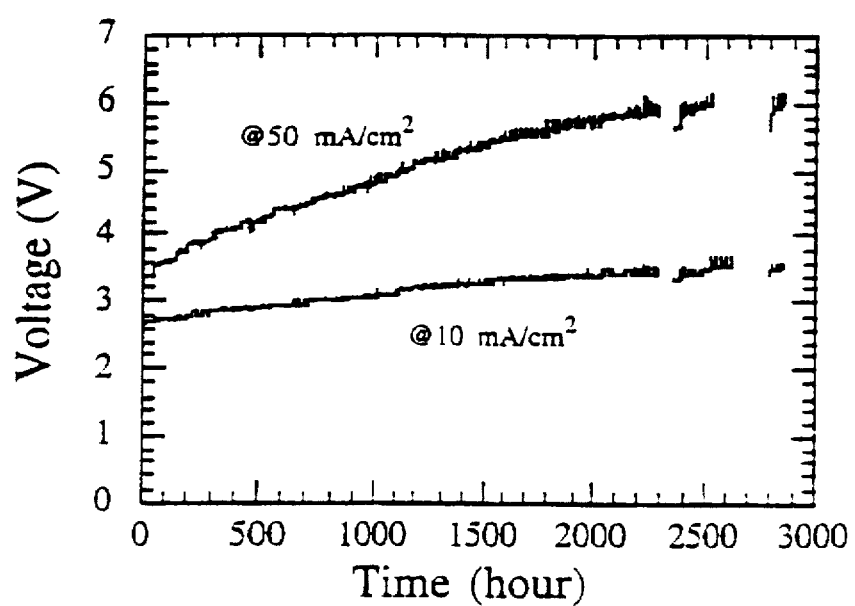

FIG. 9 illustrates operating voltage as a function of time (V-t) for a polymer LED with a PANI layer.

Figure 10:

FIG. 10 is a photograph illustrating the types of performance possible with a PANI-layer containing LED device of the invention on a patterned anode.

Figure 11:
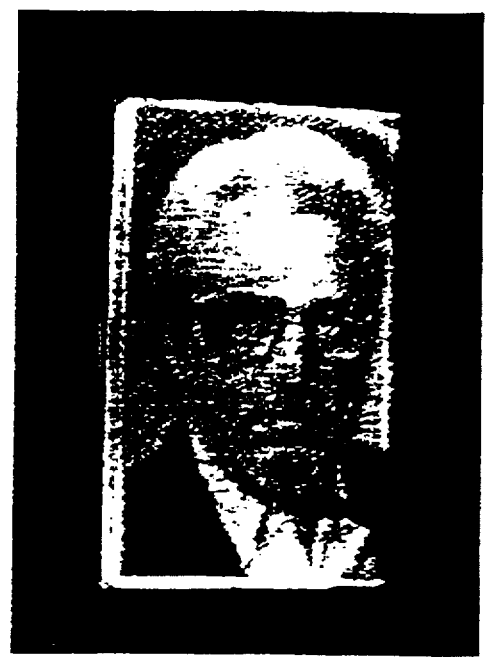

FIG. 11 is a photograph showing a portrait displayed on an image-glow device of the invention. This device having a pre-patterned portrait on it.

Figure 12:
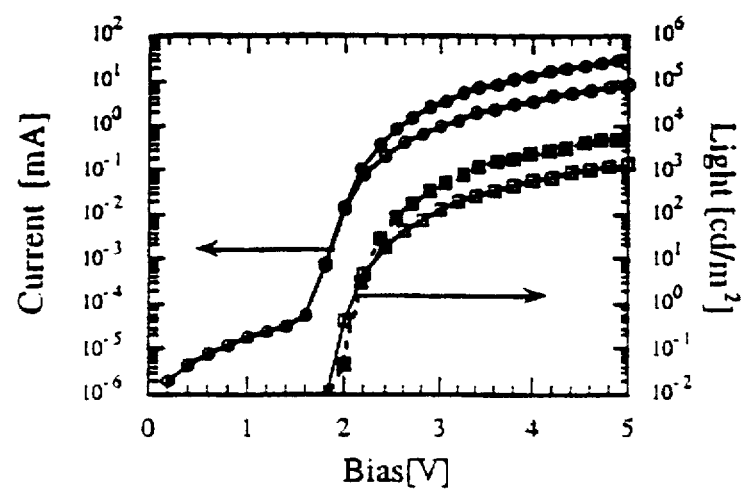

FIG. 12 illustrates current as a function of voltage (I-V) and light vs voltage (L-V) for devices made in accord with this invention using a PANI emeraldine salt form (solid symbols) and devices made with PANI in the partially deprotonated base form (open symbols).

Figure 13:
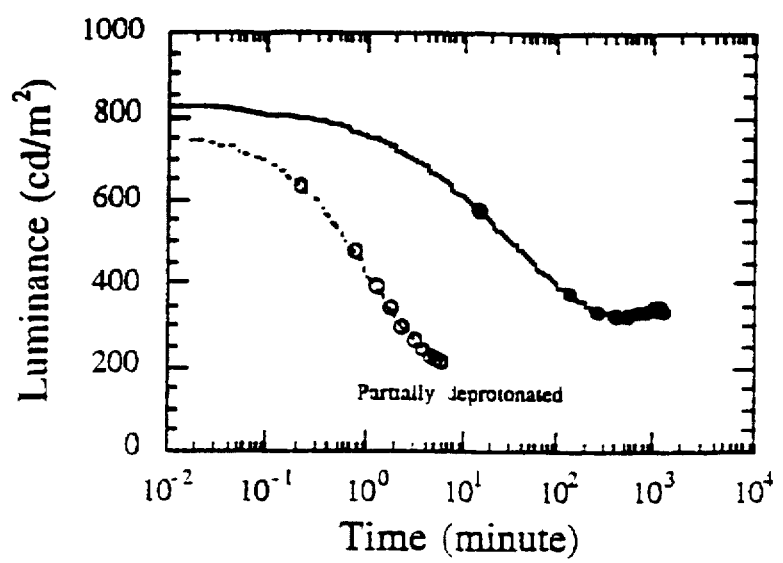

FIG. 13 illustrates luminance as a function of time for two devices. The solid circles illustrate results for a device in accord with this invention which employs a layer of PANI as emeraldine salt while the open circles indicate a device not in accord with the invention with the PANI being partially deprotonated to emeraldine base.

Figure 14:
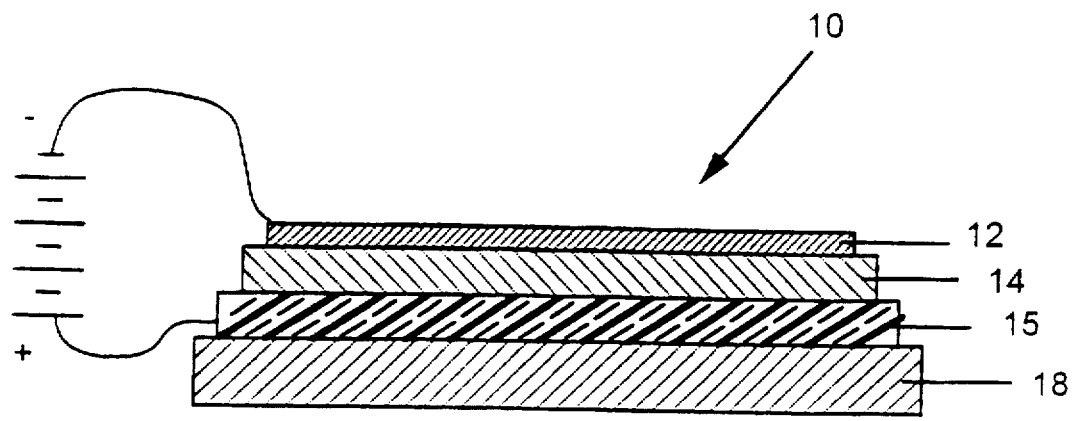

FIG. 14 is a schematic cross-section in accord with the invention showing its PANI emeraldine salt layer serving as the device anode.

Figure 15:
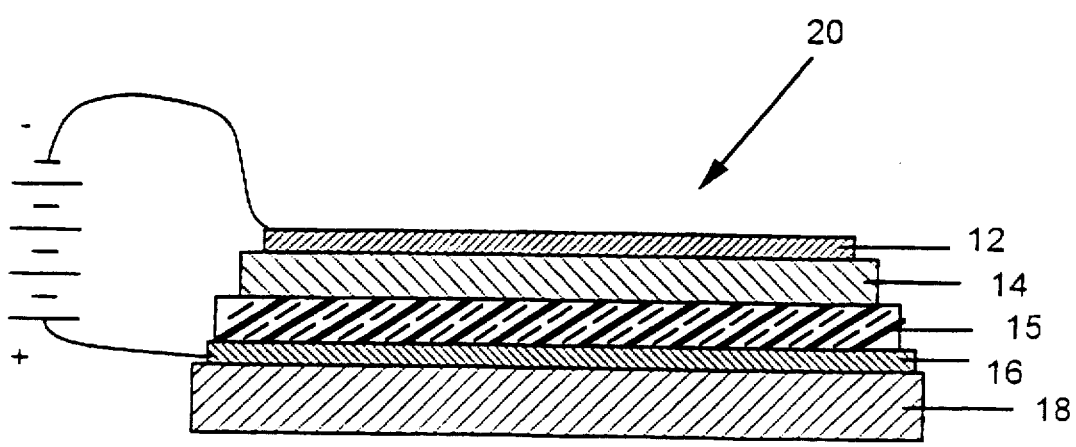

FIG. 15 is a schematic cross-section of another device in accord with this invention showing its PANI emeraldine salt layer between the anode and light-emitting layer.

DESCRIPTION OF THE PREFERRED EMBODIMENTS

The invention is based on the discovery that PANI emeraldine salt stabilizes organic LED device performance and prevents degradation (such as loss of efficiency and the formation of dark non-emitting areas known as 'black spots'), thereby leading to long operating lifetime.

Device Configuration

As shown in FIG. 15, the polymer light-emitting diode device 20 comprises an electron injecting (cathode) contact 12, for example a relatively low work function metal (Ca, Al, or the like) as one electrode on the front of a semiconducting and luminescent conjugated polymer film 14 deposited on a substrate 18 which has been partially coated with a layer 16 of transparent conducting material with higher work function (high ionization potential) to serve as the second (transparent) electron-withdrawing (anode) electrode; i.e. a configuration that is well known for polymer LEDs (D. Braun and A. J. Heeger, Appl. Phys. Lett. 58, 1982 (1991)). In accord with this invention, a layer 15 containing PANI emeraldine salt is interposed between luminescent film 14 and electrode 16.

An alternative embodiment is shown in FIG. 14 as device 10. Device 10 differs from device 20 in that it employs the PANI layer 15 itself as the electron withdrawing (anode) electrode. In this case the emeraldine salt should be in a high conductivity form. In other respects, the elements of device 10 correspond to those just described with reference to device 20.

The High Work Function Electrode (16)

In these devices any relatively high work function (high ionization potential) transparent conducting material, such as for example, sputter-deposited indium-tin oxide (ITO) or high conductivity PANI (PANI), can be used as the second (transparent) electron-withdrawing (or hole-injecting) electrode 16.

This second electrode and, when present, the support which carries it are typically "transparent" or "semitransparent" so as to permit the emitted light to pass out through them. A "transparent" or "semitransparent" material is a material which passes at least a fraction of the light impinged upon it, such as at least about 10% and preferably at least about 20% of the light emitted by the luminescent layer at the wave length of this emission.

ITO has been the most commonly used transparent electrode for polymer LEDs. On the other hand, PANI, in the high conductivity emeraldine salt form prepared according to U.S. Pat. No. 5,232,631, U.S. Pat. No. 5,470,505, U.S. patent application Ser. No. 07/800,555 (now abandoned) and Ser. No. 07/800,559 (now abandoned), and in Appl. Phys. Lett. 60, 2711 (1992)), has a higher work function than ITO (Y. Yang and A. J. Heeger, Appl. Phys. Lett. 64, 1245 (1994)), and therefore provides better hole injection into the polymer active layer. However, the surface resistance of a very thin PANI film often is too high for some applications. In order to avoid significant voltage drop in the electrode, it is desirable to decrease the surface resistance of the anode to less than about 100 ohms/square. Although this can be achieved using a thicker layer (greater than 2500 Å) of PANI, the transmittance of such a PANI electrode is less than 70%, which leads to more than a 30% loss in external quantum efficiency.

It was previously disclosed (Y. Yang and A. J. Heeger, Appl. Phys. Lett. 64, 1245 (1994); Y. Yang, E. Westerweele, C. Zhang, P. Smith and A. J. Heeger, J. Appl. Phys. 77, 694 (1995)) that when an ITO electrode is coated with a layer of conductive PANI, typically less than 1000 Å thick, the bilayer electrode thus obtained has a peak transmittance (at about 500 nm) around 90%, a work function similar to that of conductive PANI alone and a surface resistance below that of ITO. The bilayer PANI/ITO electrode offers special advantages for use in polymer LEDs in that devices comprising the bilayer PANI/ITO electrode show an increase in efficiency and a lower turn-on voltage.

The nature of the repeat units in the PANI useful in the bilayer electrode may vary widely and is not critical. Useful conductive PANIs include the homopolymer, derivatives and blends with bulk polymers. Examples of representative aniline repeat units and PANI polymers are those disclosed in U.S. Pat. No. 5,232,631 and U.S. Pat. No. 5,470,505, which are incorporated by reference herein.

In addition to these materials any other organic or electrically inorganic materials having work functions similar to ITO or conductive PANI or the combination of the two may be used. Typical thicknesses for this layer can range from a minimum of about 100 Å or so through as much as about 2500 Å as defined above. In any event the thicknesses should be selected to hold the overall surface resistance to less than about 100 ohms/square as noted above.

The Luminescent Layer (14)

A wide variety of semiconducting and luminescent conjugated polymers can be used for the active layer, and are well known in the art. Examples include but are not limited to poly(phenylene vinylene), PPV, and soluble derivatives of PPV, such as MEH-PPV (U.S. Pat. No. 5,189,136) and BCHA-PPV (U.S. patent application Ser. No. 07/626,463 (now U.S. Pat. No. 5,189,136)), PPPV (C. Zhang H. von Seggern, K. Pakbaz, B. Kraabel, H.-W. Schmidt and A. J. Heeger, Synth. Met. 62, 35 (1994) and references therein) and the like, the soluble derivatives of polythiophene, for example the poly(3-alkylthiophenes) (D. Braun, G. Gustafssom, D. McBranch, J. Appl. Phys. 72, 564, (1992)), the soluble derivatives of poly(phenylene) (L. Hamaguchi and K. Yoshino, Jpn. J. Appl. Phys. L587 (1995)), and other semiconducting conjugated polymers which exhibit photoluminescence; blends of such semiconducting and luminescent conjugated polymers in hole-transporting or electron transporting polymers or molecules (C. Zhang H. von Seggern, K. Pakbaz, B. Kraabel, H.-W. Schmidt and A. J. Heeger, Synth. Met. 62, 35, (1994); C. Zhang, S. Hoger, K. Pakbaz, F. Wudl and A. J. Heeger, J. Electron. Mater. 23, 453 (1994)), heterojunctions utilizing layers of semiconducting and luminescent conjugated polymers as donors and acceptors (N. S. Sariciftci, D. Braun, C. Zhang, V. I. Srdanov, A. J. Heeger, G. Stucky and F. Wudl, Appl. Phys. Lett. 62, 585(1993)). Typical film thicknesses of the semiconductive polymers range from a few hundred Ångstrom units to a few thousand Ångstrom units or even much thicker, i.e. from about 100 Å to 10000 Å or greater (1 mm) and especially 200 Å to 5000 Å. Although the active film thicknesses are not critical, device performance can typically be improved by using thinner films.

Low Work Function Electrode (12)

The low work function metal electrode is typically vacuum evaporated onto the top surface of the active organic layer(s). Useful metals for practice in the present invention are well known in the art and include, for example pure metals such as Ca, Al, and In, as well as low work function metal alloys such as Ag:Mg, and A:Li. Any low work function (low ionization potential) conducting material can be used in place of a conventional metal as the electron injecting contact. The thickness of the electron injecting electrode film is not critical and can be adjusted to achieve the desired surface resistance (surface resistance or sheet resistance is defined as the resistivity divided by the thickness) and can vary in the range of from about 100 Å to about 5000 Å or thicker.

The Emeraldine Salt Layer (15)

Long operating life is imparted to organic light-emitting diodes by the presence of an emeraldine salt layer (15) between the high work function electrode (16) and the luminescent layer (14). The emeraldine salt layer useful for obtaining long operating life can be pure PANI; for example, PANI in the emeraldine salt form protonated with camphor sulfonic acid, protonated with dodecylbenzene sulfonic acid, or protonated with any suitable protonic acid. The PANI layer also can be a blend of PANI in a host polymer. Suitable host polymers include, but are not limited to polymethylmethacrylate, polyester, polyvinylalcohol etc. A wide range of PANI blends have been disclosed (Y. Cao, P. Smith and A. J. Heeger, Synth. Met. 55–57, 3514 (1993); U.S. Pat. No. 5,232,631 and U.S. Pat. No. 5,470,505). The network morpholgy of the PANI in such blends provides additional advantages (A. J. Heeger, Trends in Polymer Science 3, 39 (1995), Y. Yang, E. Westerweele, C. Zhang, P. Smith and A. J. Heeger, J. Appl. Phys. 77, 694 (1995), Y. Yang and A. J. Heeger, U.S. Pat. No. 5,563,424; and application Ser. No. 08/218,321 (now abandoned)). By varying the concentration of PANI in the PANI network blends, the surface resistance can be precisely controlled over many orders of magnitude (M. Reghu, C. O. Yoon, C. Y. Yang, D. Moses and A. J. Heeger, Macromolecules 26, 7245 (1993)).

If a blend of PANI with a host polymer is employed, typically, the PANI content will range from about 3% of the total blend up to 100% and preferably from about 5% to 100%. This emeraldine salt layer ranges in thickness from about 50 Å to about 5000 Å or even 10000 Å or greater and particularly from about 100 Å to about 2500 Å although thicker layers can be used if desired.

In a preferred aspect of the invention, the layer of PANI (15) is present in a low conductivity (high resistivity) emeraldine salt form. Depending upon the way it is deposited, a PANI film can be formed in a high conductivity state or in a low conductivity state. Although not understood with certainty, it is generally believed that the high conductivity PANI films result when the aromatic rings of the aniline repeat units from neighboring chains are permitted to stack upon one another and thus promote $\pi$ band conductivity and the lower conductivity materials result when the aromatic rings are not so aligned. If a low conductivity (high resistivity) PANI layer is formed it may have surface resistance sufficiently high to enable high information content displays without need for registered patterning of the PANI layer and without deleterious lateral spreading or blurring even when the indium/tin-oxide on the underlying substrate is patterned.

The spreading distance (L) resulting from the PANI layer is $$L=(RG)^{-\frac{1}{2}}$$

where R is the surface resistance of the PANI in ohms/square, and G is the conductance to ground in ohms$^{-1}$-cm$^{-2}$. Thus to prevent lateral spreading or blurring, L must be less than the feature size of the display. Thus if the underlying electrode is patterned with typical dimension $d_{pattern}$, then to prevent spreading and blurring, L must be much less than $d_{pattern}$.

For example, if the organic LED includes a layer of PANI (15) in the emeraldine salt form and that PANI layer is cast from solution in diemethylsulfoxide, DMSO, it can have a surface resistance greater than $10^5$ ohms/square which permits a suitably low value for L to yield high display resolution and high information content displays without need for registered patterning of the PANI layer and without deleterious lateral spreading or blurring even when the indium/tin-oxide on the underlying substrate is patterned.

Fabrication Methods

The various elements of the devices of the present invention may be fabricated by any of the techniques well known in the art, such as solution casting, screen printing, contact printing, sputtering, evaporation, precursor polymer processing, melt-processing, and the like, or any combination thereof.

The present invention provides a method for obtaining long operating life by using an anode comprising PANI in the emeraldine salt form. In a preferred embodiment, PANI in the emeraldine salt form is dissolved in a suitable solvent. A thin semitransparent film is then cast onto a substrate such as an optional thin layer of ITO or semitransparent metal on glass, plastic, ceramic, or silicon etc. The organic LED is then built with successive layers as described above. By processing the PANI from selected solvents the conductivity of the PANI can be varied and the long operating life obtained without deleterious lateral spreading or blurring even when the indium/tin-oxide or semitransparent metal on the underlying substrate is patterned. Thus, the invention discloses a method for obtaining long operating life high information content displays.

Although the sheet resistance for current in the plane of the PANI layer may be large, the current in the plane is carried primarily by the underlying low sheet resistance substrate. On the other hand, the resistance through the thin PANI layer is sufficiently low compared to the total device resistance that the voltage drop, if any, through the PANI layer is unimportant. The high sheet resistance of the PANI layer prevents spreading of the features of the image imparted by patterning of the underlying low sheet resistance substrate (for example, ITO).

The manner in which the PANI layer is deposited can have a substantial effect upon its conductivity. For example, if the emeraldine salt layer is cast from a simple aromatic hydrocarbon or oxyhydrocarbon such as for example M-cresol, toluene or xylene typically the high conductivity form is obtained. In contrast, if the emeraldine salt is cast from more polar materials such as for example methylsulfoxide (DMSO), tetramethyllenesulfoxide, 4-butylactone, propylenecarbonate, chloroform ($CHCl_3$), chlorobenzene, trichlorobenzene, dichloromethane, formic acid, benzylalcohol, trifluoroethanol, octafluoropentanol, formic acid, acetic acid and trichloroacetic acid, and especially DMSO, the relatively low conductivity form will be achieved.

The remarkable improvement in the operating life of the organic LED, by a factor of 100 or more as compared with an essentially identical device made without the PANI emeraldine base layer, is unexpected, surprising and not understood. With the PANI emeraldine base layer, operating lifetimes in excess of 1000 hours are obtained at high initial brightness (400–500 cd/m$^2$) and operating lifetimes (extrapolated) in excess of 10,000 hours are obtained at display brightness (50–100 cd/m$^2$).

The following general methods and specific examples are presented merely to illustrate the invention and are not to be construed as limitations thereon.

EXAMPLES

Example 1

The electrically nonconductive (emeraldine base) form of PANI (PANI), 9.05 g, was mixed with 11.62 g (±)-10-camphorsulfonic acid (CSA) in 100 ml anhydrous ethanol. The mixture was stirred at 60° C. for 30 minutes and cooled to room temperature. Ethanol was removed by vacuum evaporation followed by drying under dynamic vacuum at room temperature for 24 hours. Four grams (4.0 g) of the PANI-CSA powder was mixed with 96 g of dried dimethyl sulfoxide (DMSO). The mixture was stirred at 60° C. for 24 hours. Most of the PANI-CSA complex dissolved to give a deep green solution. Residual insoluble solids were removed by centrifuging. The solution was evaporated to yield a solid. The PANI-CSA complex thus obtained was weighed to calculate the content of the conductive PANI-CSA complex, 3.5%, in said solution. The experiment was repeated substituting other acids for CSA, including 4-hydroxybenzenesulfonic acid (HBSA), p-chlorobenzenesulfonic acid and 4-dodcylbenzenesulfonic acid (DBSA). The experiment was repeated using other solvents (instead of DMSO) including m-cresol, N-methyl pyrrolodinone, toluene and xylenes.

This example demonstrates the preparation of the conducting emeraldine salt of PANI and demonstrates that said PANI is soluble in common organic solvents.

Example 2

1 g of a solution of the PANI-CSA solution in DMSO as prepared in example 1 was mixed with 4.9 g of 5% poly (vinyl alcohol) (PVA, Polysciences) solution in DMSO at room temperature for 1 hour. The content of PANI-CSA in the blend solution was 25%.

The experiment was repeated, but the content of PANI-CSA in the blend was, respectively, 10, 15, 17.5, 20, 50, 75, and 90%.

The experiment was repeated substituting other host polymers for PVA, such as polyacrylonitrile (PAN), poly(vinyl acetate) (PVAc), poly(vinyl pyrrolidone) (PVPd), poly(vinyl butyral) (PVB) and low molecular weight polyesters (PES).

This example demonstrates that blends of PANI-CSA can be made with PVA and other host polymers.

Example 3

The DMSO solution of PANI-CSA, as prepared in example 1, was spin coated at 5000 rpm, in air, onto a glass substrate which was partially coated with ITO, and thereafter, baked at 50° C. in air for 15 hours.

A p-xylene solution of MEH-PPV was spin coated at 1000 rpm onto the PANI thin film on the ITO film (in an argon glove box). The film was dried at 60° C. for 15 hours. A calcium electrode was formed thereon by vapor deposition to a thickness of 2000 angstroms. When a current of 5 mA was passed between the anode and the cathode of the resulting device, orange light with a quantum efficiency of 1.8% photons per electron was observed at 3.03 V. The peak wavelength of the emission spectrum was 590 nm.

This example demonstrates that efficient polymer LED devices can be fabricated using PANI in the emeraldine salt form as a layer between the low resistance anode and the active luminescent polymer layer.

Example 4

FIGS. 1a and 1b compare the light vs voltage (L-V) and efficiency vs current ($\eta$-I) data from devices made without a PANI-CSA layer and devices made with a PANI-CSA layer; i.e. ITO/MEH-PPV/Ca and a ITO/PANI/MEH-PPV/Ca devices. The devices with the PANI layer were fabricated by processing from m-cresol solution; in this case, pure PANI-CSA was used for the PANI layer. The devices with the PANI layer had the same operating electrical characteristics and similar efficiencies as those without the PANI layer.

This example shows that the PANI layer can be added with to the device with no sacrifice in device performance.

Example 5

Example 3 was repeated, but the PANI layer was spin coated from the blend solutions as prepared in example 2.

The performance of the resulting light-emitting diodes is summarized in Table 1 and FIG. 2.

TABLE 1

Device Performance of Light-emitting Diodes on (PANI-CSA)/PVA Electrodes

| PANI-CSA Content | Efficiency (%) at 35 mA/cm$^2$ | Voltage (V) at 35 mA/cm$^2$ |
| --- | --- | --- |
| 10 | 0.4 | 8.87 |
| 15 | 1.9 | 4.01 |
| 17.5 | 2.1 | 3.06 |
| 20 | 2.0 | 2.83 |
| 25 | 2.0 | 2.81 |
| 50 | 1.8 | 3.64 |
| 75 | 1.4 | 3.06 |
| 90 | 1.7 | 3.01 |
| 100 | 1.8 | 3.03 |

This example demonstrates that polymer LED devices can be fabricated with a PANI layer using PANI-CSA/PVA blends at various concentrations; said devices having excellent performance.

Example 6

Example 3 was repeated, but a highly conducting and transparent PANI-CSA layer (greater than 100 S/cm) was used as anode instead ITO layer. The highly conducting PANI-CSA layer was formed by casting from m-cresol solution onto a glass substrate. Similar quantum efficiencies were observed for devices using PANI-CSA layer and devices with ITO as anode. The brightness of the device with PANI anode (without ITO) reached 1000 cd/m$^2$. The operating life (half life) was close to 1000 hours for the device with PANI anode (without ITO support), much greater than the half life (ca. 2 hours) of the device fabricated with the ITO anode (without PANI layer) (FIG. 3).

This Example illustrates that solution-processable, highly conducting and transparent PANI in the emeraldine salt can be used alone as anode without ITO support and provide long operating life.

Example 7

When fabricating polymer LEDs with ITO as the anode, the cleanliness of the ITO has been found to be a critical factor in determining the device performance. Devices were made as described in Example 5 with and without cleaning the ITO. With PANI layer as the hole injection contact, the device performance was insensitive to the pre-treatment (cleaning) of the ITO.

This Example demonstrates that the PANI layer serves to mitigate defects on the underlying substrate.

Example 8

The light-emitting diode prepared with 25% PANI-CSA in the blend (see Example 5) was run at 35 mA/cm$^2$ constant current in argon glove box to evaluate the stress life of the device. After 1000 hours stress, the device efficiency was 0.91% photon/electron (0.61 of the initial value) with light output of approx. 300 cd/m$^2$ at 4.81 V. The area of the light emission showed less than 10% black spots after running continuously at 35 mA/cm$^2$ for 1000 hours. The stress life (operating life) data are shown in FIG. 4. A similar device, identical except that PANI-HBSA was used instead of PANI-CSA, had the same operating life as the device made with PANI-CSA.

This Example demonstrates that the addition of the PANI layer provides a method for obtaining long operating life for organic (polymer) LEDs.

Example 9

In FIG. 5, the stress life (operating life) of a ITO/MEH-PPV/Ca device is compared with a ITO/PANI-CSA/MEH-PPV/Ca device under identical conditions (35 mA/cm$^2$, approx. 450 cd/m$^2$ initial brightness). In this experiment, the MEH-PPV layers were cast from the same solution with similar spin speeds, thus with similar film thickness. The PANI layer was spin cast from a PANI-CSA m-cresol solution (2%) at 5000 rpm.

Although both devices had similar initial brightness, EL efficiency and operating voltage, the operating life was significantly greater in the device with the PANI-CSA layer. The operating time to one-half the initial brightness, the half-life, was approx. 12 hours for the device without the PANI-CSA layer and greater than 1500 hours for the device with the PANI-CSA layer. More specifically, the brightness dropped to 85% of its initial value in 1.2 hours for ITO-only device while the device with the PANI-CSA layer was at 85% of initial value after 1400 hours of continuous operation; i.e., the operating life was improved by approx. 10$^3$ times with the PANI layer.

Example 10

FIG. 6 compares the increase of the operating voltage with operating time (stress time) as the EL efficiency decayed. For the device with PANI-CSA layer on top of ITO (Example 4), the voltage increases approximately linearly with operating time at a rate of only 9.5×10$^{-6}$ ohm-cm$^2$/sec (solid curve in FIG. 5 and in the inset). Using blends of PANI-CSA in polyester (denoted as PANI-CSA/PES) as the anode layer, even lower rates, 3–6×10$^{-6}$ ohm-cm$^2$/s, were observed. Without the PANI layer, i.e. for ITO/MEH-PPV/Ca devices, the rate of increase was two orders of magnitude higher, approx. 6.3×10$^{-4}$ ohm-cm$^2$/s (open circles in FIG. 5). Thus, the PANI layer on the anode improved the voltage stability by approx. 100 times in addition to improving device operating life.

This Example demonstrates that by using the PANI layer, the operating voltage is stabilized.

Example 11

Example 9 was repeated, but a blend of PANI-CSA/PES (weight fraction of PANI-CSA in the blend is ca. 25%) was used as the hole injection layer. FIG. 7 shows typical operating life data for the device; i.e. light vs time (L-t) dependence. The efficiency vs time (η-t) and voltage vs time (V-t) data are shown in FIGS. 8 and 9. Two operating conditions were used for this test: 50 mA/cm$^2$ and 10 mA/cm$^2$. Under 50 mA/cm$^2$, the luminance (and EL efficiency) decayed to a half of its initial value (the half-life) after approx. 1800 hours. This time corresponds to a total charge of 3.2×10$^5$ Coulombs/cm$^2$. The half-life of the luminance and EL efficiency at 10 mA/cm$^2$ was much longer than that at 50 mA/cm$^2$; in fact at 10 mA/cm$^2$ the half-life is longer than total testing time (approx. 2900 hours). Extrapolated operating half-life for the device driven at 10 mA/cm$^2$, yields a half-life greater than 8000 hours.

The PANI-CSA/PES blend layer also improves the stability of operating voltage by more than two orders of magnitude. For the device driven at 50 mA/cm$^2$, the operating voltage increased by only approx. 2.5 V after 2500 hours, corresponding to a total charge of $4.5 \times 10^5$ C/cm$^2$. The rate of increase in device resistance was $5.5 \times 10^{-6}$ ohm-cm$^2$/sec. These numbers are $10^2$–$10^3$ times smaller than found without the PANI layer.

The PANI-CSA/PES layer reduced the formation of black spots. For the devices in this Example, less than 10 percent black spots were observed after operating (greater than 2500 hours at 50 mA/cm$^2$) and after storage for 4.5 months.

This Example demonstrates the improved operating life obtained with the PANI layer.

Example 12

The light output for each of the LEDs prepared in Table 1 was examined with or without ITO underneath the PANI blends at 35 mA/cm$^2$. The results are summarized in Table 2. Without ITO underneath, the device did not light up on PANI electrodes prepared from DMSO solutions.

This Example demonstrates that one can pattern the output by simply patterning the ITO substrates, a result which has been well known. This Example also shows that PANI layer on the top of ITO will not spread or blur the image.

TABLE 2

Light Output From the Light-Emitting Diodes on (PANI-CSA)/PVA Electrodes

| PANI-CSA Content (%) | With ITO at 35 mA/cm$^2$ | Without ITO at 35 mA/cm$^2$ |
|---|---|---|
| 10 | yes | no |
| 15 | yes | no |
| 17.5 | yes | no |
| 20 | yes | no |
| 25 | yes | no |
| 50 | yes | no |
| 75 | yes | no |
| 90 | yes | no |
| 100 | yes | no |

Example 13

A light-emitting device was fabricated as in example 5 with 17.5% PANI-CSA in PVA. In this Example, the ITO substrate was patterned with the "UNIAX LEDs" logo. As shown in FIG. 10, the letters and detail of the logo show up clearly when the device was turned on.

This Example demonstrates that one can pattern the output by simply patterning the ITO substrates, a result which has been well known. This Example also shows that PANI layer on the top of ITO will not spread or blur the image.

Example 14

Example 13 was repeated by pre-patterning a portrait into the ITO to demonstrate large size, high performance display devices with information pre-patterned onto the ITO. Due to the moderate resistivity of the PANI-CSA/PVA layer, the ITO/PANI-PVA/MEH-PPV/Ca device showed the pattern defined by the ITO and Ca electrodes without spreading or blurring. With PANI-CSA concentration of 17.5% in the blend, the sharpness of the edge was a few microns.

Information was pre-patterned into the ITO by means of photolithography. Using this pre-patterned ITO substrate, large area devices were fabricated. FIG. 11 shows a portrait which was initially patterned in halftone format in ITO. The emissive image was observed when a voltage was applied to the device. The glowing image disappeared when the voltage was turned off.

This example demonstrates that the PANI-CSA/PVA layer can be used for making large size, high performance display devices with information pre-patterned onto the ITO. Since the image is not blurred by the continuous PANI layer, patterning of the PANI layer is not required.

Example 15

Devices with the PANI layer exhibited reduced formation of black spots. For the PANI device discussed in Examples 8, 9 and 11, there were no noticeable black spots after 1500 hours of operation at 35 mA/cm$^2$. In contrast, more than 20% black spots were observed in ITO devices (with no PANI layer) after 2 months storage in a controlled atmosphere dry box.

This Example shows that for ITO-only devices, the black spots form much faster during operation, typically to greater 20% within a few hundred hours. This Example also demonstrates that the PANI layer prevents black spot formation.

Example 16

Deprotonation of the PANI layer to the insulating emeraldine base form leads to a reduction in the bulk conductivity and to a change the color of the PANI film from green (the emeraldine salt form) to blue (the emeraldine base form). Pure PANI-CSA and PANI-CSA in a blend with PVA (see Examples 3 and 5) were cast from DMSO solution onto ITO glass in the emeraldine salt form. The concentration of PANI-CSA in the blend was 17.5%. PANI films were deprotonated by exposure to water vapor; other PANI films were deprotonated by exposure to ammonia gas. After deprotonated, the color of the PANI film changed from green to blue.

Light-emitting diode devices were fabricated in the usual manner by spin-casting a layer of MEH-PPV onto the PANI-blend films and then vapor depositing a layer of calcium.

The deprotonation of the PANI layer did not affect the device efficiency for currents less than 10 mA (less than 100 mA/cm$^2$). However, the device operating voltage increased, and the operating lifetime was significantly reduced compared to identical devices made with PANI in the emeraldine salt form. FIG. 12 compares the current vs voltage (I-V) and light vs voltage (L-V) dependences found for a PANI-PVA (salt) and a PANI-PVA(base) device. Due to deprotonation of the PANI layer, the resistivity of the PANI layer increased significantly (to a level comparable to that of the MEH-PPV layer), resulting in a substantial increase in device operation voltage (more than one volt for a given luminance). The two devices (compared in FIG. 12) were made in the same configuration. ITO/PANI-PVA(DMSO)/MEH-PPV/Ca devices with similar thicknesses for the PANI-PVA and MEH-PPV layers. One of them was in its original salt form as prepared. The other one was partially deprotonated to the blue form.

The operating life of the ITO/PANI-PVA(salt)/MEH-PPV/Ca devices is significantly enhanced to values over $10^3$ hours as shown in Examples 8, 9 and 11. This enhanced operating life which was reproducibly observed for devices fabricated with the emeraldine salt layer was not observed in devices in which the PANI layer had been deprotonated to the emeraldine base form.

This Example demonstrates that the enhanced operating life obtained from devices fabricated with a PANI emeraldine salt layer is not obtained when the PANI layer is in the emeraldine base form.

Example 17

Large area (1.5 in.×2.5 in active area) PANI devices were fabricated: the PANI-CSA/PVA layer was spin-cast in air in the open laboratory, the MEH-PPV layer was spin-cast in a dry box with class 1000 air handling. Ca was vapor deposited in vacuum. Ten such devices were tested with excellent yield; all ten devices worked (no shorts).

This high yield without a clean room environment is surprising since devices with dimensions of inches are impractical even in Si industry in ultra-clean (class 10) environment because of low yield.

This example demonstrates that the PANI-CSA/PVA layer (from DMSO; see Examples 3, 5 and 8) not only improved device life, the PANI layer also prevented the formation of shorts from pinholes or other defects in the MEH-PPV layer. Higher yields of devices without shorts were obtained with the PANI layer than in comparable devices without the PANI layer. The higher yield (without shorts) was found to be especially important for fabrication of larger area devices. The attainment of high yields is required for fabrication of high pixel density x-y passive matrix arrays, since shorts on a panel will result in cross-talk.

Example 18

The bulk resistivity of the PANI layer can be varied over broad range without affecting the device operation voltage. In pure PANI-CSA and PANI-CSA/PES blends (greater than 10%), the conductivity is approx. 10 S/cm (resistivity equal to 0.1 ohm/cm). The surface resistivity of a 1000 Å film is thus $10^4$ ohms per square.

A low resistivity PANI layer was therefore used as the anode electrode in a polymer LED (MEH-PPV with calcium as cathode) without any underlying ITO layer; light was emitted over the entire area (greater than 1 cm$^2$) defined by the PANI and the cathode Ca electrodes.

Using PANI blend layers with moderate resistivity (in range between 0.1 ohm-cm and $10^5$ ohm-cm) between the ITO and MEH-PPV layers in light-emitting devices, the edge sharpness was controlled (tuned). Image-glo devices (described in example 14) were fabricated using PANI with conductivity in this range. The image softness and image quality were improved and pleasing to the eye.

This example demonstrates that by using PANI layers with different surface resistance, controlled spreading and blurring of the image can be achieved to advantage.

We claim:

1. An organic light-emitting diode having an operating lifetime in excess of 1000 hours comprising a semitransparent anode having a sheet resistance of less than $10^3$ ohms per square separated from an organic light-emitting layer by an intermediate layer comprising polyaniline emeraldine salt said intermediate layer having a sheet resistance of more than $10^3$ ohms per square.

2. The organic light-emitting diode of claim 1 wherein the semitransparent anode has a sheet resistance of less than $10^2$ ohms per square.

3. The organic light-emitting diode of claim 1 wherein the intermediate layer consists essentially of polyaniline emeraldine salt.

4. The organic light-emitting diode of claim 1 wherein the intermediate layer comprises a blend of polyaniline emeraldine salt and host polymer.

5. An organic light-emitting diode having an operating lifetime in excess of 1000 hours comprising in layer order a semitransparent anode layer having a sheet resistance of less than $10^3$ ohms per square an intermediate layer comprising polyaniline emeraldine salt said intermediate layer having a sheet resistance of more than $10^3$ ohms per square an organic light-emitting layer and a cathode layer.

6. The organic light-emitting diode of claim 5 additionally comprising a transparent support which carries the anode layer.

7. The organic light-emitting diode of claim 5 wherein the semitransparent anode has a sheet resistance of less than $10^2$ ohms per square.

8. The organic light-emitting diode of claim 5 wherein the intermediate layer has a sheet resistance of greater than $10^4$ ohms per square.

9. The organic light-emitting diode of claim 8 wherein the intermediate layer consists essentially of polyaniline emeraldine salt.

10. The organic light-emitting diode of claim 8 wherein the intermediate layer comprises a blend of polyaniline emeraldine salt and host polymer.

11. A method for producing usable levels of light over a prolonged period of time comprising applying a turn on voltage exceeding voltage across the device of claim 5 thereby giving rise to light emission from the device and using the light so emitted for at least 1000 hours.

12. A display having an operating lifetime in excess of 1000 hours comprising the light emitting diode of claim 5 wherein the anode layer is patterned.

13. A method for forming an organic light-emitting diode having an operating lifetime in excess of 1000 hours, said diode having in layer order a semitransparent anode layer having a sheet resistance of less than $10^3$ ohms per square an intermediate layer comprising polyaniline emeraldine salt said intermediate layer having a sheet resistance of more than $10^3$ ohms per square an organic light-emitting layer and a cathode layer, comprising depositing the intermediate layer upon the anode layer from solution comprising emeraldine salt in a liquid selected from the group consisting of DMSO, tetramethylsulfoxide, 4-butylactone, propylene carbonate, chloroform, chlorobenzene, dichloromethane, benzyl alcohol, trifluoroethanol, octafluoropentanol, formic acid, acetic acid, trichloroacetic acid and mixtures thereof, depositing the organic light-emitting layer upon the intermediate layer and depositing the cathode layer upon the light emitting layer.

14. The method of claim 13 wherein the liquid comprises DMSO.

15. The method of claim 14 wherein the solution additionally comprises host polymer.

* * * * *